United States Patent
Lim et al.

(10) Patent No.: US 12,334,381 B2
(45) Date of Patent: Jun. 17, 2025

(54) GUIDE UNIT, TRANSFER ASSEMBLY AND DIE BONDING APPARATUS INCLUDING THE SAME

(71) Applicant: SEMES CO., LTD., Cheonan-si (KR)

(72) Inventors: Do-Youn Lim, Hwaseong-si (KR); Yeon Hyuk Jung, Cheonan-si (KR); Eung Seok Kim, Cheonan-si (KR); Byoung Ho Jung, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 250 days.

(21) Appl. No.: 17/838,333

(22) Filed: Jun. 13, 2022

(65) Prior Publication Data
US 2022/0399221 A1    Dec. 15, 2022

(30) Foreign Application Priority Data

Jun. 14, 2021 (KR) .................. 10-2021-0076566

(51) Int. Cl.
| | | |
|---|---|---|
| *H01L 21/677* | (2006.01) | |
| *H01L 21/67* | (2006.01) | |
| *H01L 21/68* | (2006.01) | |
| *H01L 21/687* | (2006.01) | |

(52) U.S. Cl.
CPC .. *H01L 21/67766* (2013.01); *H01L 21/67144* (2013.01); *H01L 21/68* (2013.01); *H01L 21/68707* (2013.01)

(58) Field of Classification Search
CPC ......... H01L 21/67766; H01L 21/67144; H01L 21/68; H01L 21/68707; H01L 21/67778; H01L 21/67742; H01L 21/67751; H01L 24/741; H01L 21/6732
See application file for complete search history.

(56) References Cited

U.S. PATENT DOCUMENTS

2017/0287748 A1* 10/2017 Hwang ............. H01L 21/67144

FOREIGN PATENT DOCUMENTS

| KR | 1020060099981 A | 9/2006 |
|---|---|---|
| KR | 20090112105 A * | 10/2009 |
| KR | 200470832 B1 | 1/2014 |
| KR | 1020190021428 A | 3/2019 |

OTHER PUBLICATIONS

Korean Patent Office, Office Action issued on Jan. 31, 2025 for the corresponding KR application No. 10-2021-0076566.

* cited by examiner

*Primary Examiner* — S. Behrooz Ghorishi
(74) *Attorney, Agent, or Firm* — Li & Cai Intellectual Property (USA) Office

(57) ABSTRACT

The inventive concept provides a transfer assembly. The transfer assembly includes a transfer robot configured to take out the transfer object stored at the cassette and to transfer in a first direction to the target position; and a guide unit providing a transfer passage for transferring the transfer object, and wherein the guide unit comprises: a first guide member provided with its lengthwise direction in the first direction; and a second guide member provided with its lengthwise direction in the first direction, and space apart from the first guide member in a second direction perpendicular to the first direction the first guide member and the second member defining the transfer passage therebetween, and wherein at least a portion of the first guide member is movable such that a width of the transfer passage is changeable by the movement of the at least a portion of the first guide member.

8 Claims, 12 Drawing Sheets

GUIDE UNIT, TRANSFER ASSEMBLY AND DIE BONDING APPARATUS INCLUDING THE SAME

CROSS-REFERENCE TO RELATED APPLICATIONS

A claim for priority under 35 U.S.C. § 119 is made to Korean Patent Application No. 10-2021-0076566 filed on Jun. 14, 2021, in the Korean Intellectual Property Office, the entire contents of which are hereby incorporated by reference.

TECHNICAL FIELD

Embodiments of the inventive concept described herein relate to a guide unit, and a transfer assembly and a die bonding apparatus including the same.

BACKGROUND

The manufacturing process of a semiconductor package includes a sawing process to individualize a semiconductor chip by cutting a wafer, a die bonding process to attach an individualized semiconductor chip to a lead frame or a printed circuit board (PCB), a wire bonding process to electrically connect the semiconductor chip with the lead frame or the PCB, a molding process to surround the semiconductor chip, a trim and form process to cut and bend leads, and a test process to check a semiconductor package completed through the above process for defects.

A die bonder is an apparatus used in a die bonding process, and is an apparatus for manufacturing a semiconductor product in which a die (individualized semiconductor chip) is attached to a lead frame or a printed circuit board (PCB) via an adhesive material such as an epoxy and a tape. The die bonder largely divides into a wafer logistics related to a wafer movement, an index logistics related to a lead frame or a PCB movement, and a die logistics related to a movement of each die. In this case, the wafer type in the die bonder includes transferring a wafer loaded on a cassette to an expander.

FIG. 1 is a plan view schematically illustrating a conventional die bonding apparatus. Referring to FIG. 1, the die bonder 1 includes a cassette 3 for loading a wafer ring 2 having an attached wafer W consisting of a plurality of dies at regular intervals, an expander 4 for stretching and expanding the wafer ring 2, a transfer unit 5 for transferring and seating the wafer ring 2 loaded on the cassette 2 to the expander 4, and a guide member 6 for guiding and restricting a movement of the wafer ring 2 during a transfer of the wafer ring 2.

FIG. 2 is an enlarged view illustrating part A and part B of FIG. 1. Referring to FIG. 2, when the wafer ring 2 is loaded on the cassette 3 in a state of being biased to one side or rotated, the wafer ring 2 is transferred to the expander 4 by the transfer unit 5 without maintaining a horizontal state. In this case, there is a problem in that when a front end of the wafer ring 2 contacts the guide member 6, a rear end of the wafer ring 2 simultaneously contacts a wall surface of the cassette 3, causing a load and an entrapment.

In addition, when the load or the entrapment occurs, an overload is applied to the gripper of the transfer unit 5 fixing the wafer ring 2, causing an abnormal gripping force of a gripper, and in this case, the wafer ring 2 may not be gripped and thus released.

In addition, there is a problem of a facility stopping due to a transfer failure error of the wafer ring 2 and a problem of a process delay due to the facility stopping.

SUMMARY

Embodiments of the inventive concept provide a guide unit capable of preventing a wafer ring from being caught in a structure such as a guide member or a wall surface of a cassette during a transfer of the wafer ring within a die bonding apparatus, and a transfer assembly and a die bonding apparatus including the same.

Embodiments of the inventive concept provide a guide unit capable of correcting an alignment of a wafer ring even when if the wafer ring is loaded or is transferred while being loaded on a cassette in a horizontal state or in an incorrect position, and a transfer assembly and a die bonding apparatus including the same.

The technical objectives of the inventive concept are not limited to the above-mentioned ones, and the other unmentioned technical objects will become apparent to those skilled in the art from the following description.

The inventive concept provides a transfer assembly for transferring a transfer object stored at a cassette to a target position. The transfer assembly includes a transfer robot configured to take out the transfer object stored at the cassette and to transfer in a first direction to the target position; and a guide unit providing a transfer passage for transferring the transfer object, and wherein the guide unit includes: a first guide member provided with its lengthwise direction in the first direction; and a second guide member provided with its lengthwise direction in the first direction, and spaced apart from the first guide member in a second direction perpendicular to the first direction the first guide member and the second guide member defining the transfer passage therebetween, and wherein at least a portion of the first guide member is movable such that a width of the transfer passage is changeable by the movement of the at least a portion of the first guide member.

In an embodiment, the first guide member includes: a fixed body; and a moving body hinged to the fixed body, the moving body being the at least a portion of the first guide member and being movable by a physical contact with the transfer object and wherein the moving body is rotatably movable with respect to the fixed body around an axis of a hinge.

In an embodiment, the moving body is hinged to the fixed body at a position in which first end of the moving body and first end of the fixed body overlap, and the moving body moves in a direction away from the transfer object with respect to an axis of the first direction by a physical contact with the transfer object.

In an embodiment, second end of the moving body and second other end of the fixed body is coupled by an elastic member, and the moving body moved by the physical contact with the transfer object reverts back to an original position by a restoring force of the elastic member.

In an embodiment, the moving body further includes: a plurality of holes formed at the second end of the moving body and arranged in a row in the first direction; and a pin member selectively coupled to any one hole of the plurality of holes, and wherein the first end of the elastic member is fixed to the pin member of the moving body, and the second end of the elastic member is fixed to the fixed body.

In an embodiment, the guide unit is positioned adjacent to the cassette.

In an embodiment, the moving body is pin-coupled to the fixed body and at a position in which a central area of the moving body and a central area of the fixed body overlap, and wherein first end of the moving body moves in a direction away from the transfer object with respect to an axis of the first direction by a physical contact with the transfer object, and second end of the moving body moves toward the axis of the first direction.

In an embodiment, the guide unit further includes a torsional spring provided at the central area of the moving body and the central area of the fixed body, and wherein first end of the torsional spring is fixed to the moving body, and second end of the torsional spring is fixed to the fixed body, and the moving body moved by a physical contact with the transfer object reverts back to an original position by a restoring force of the torsional spring.

In an embodiment, the first guide member includes: a fixed body; and a moving body coupled to the fixed body, the moving body being the at least a portion of the first guide member and being movable by a physical contact with the transfer object and wherein the moving body is movable in a second direction perpendicular to the first direction with respect to the fixed body, and the moving body moves in a direction away from the transfer object by a physical contact with the transfer object.

In an embodiment, the fixed body includes a first part having a first top surface, a second part having a second top surface positioned at a higher position than the first top surface and positioned stepped with the first top surface, and a groove formed at the first top surface, and wherein the moving body is positioned at the groove and linearly moves within the groove.

In an embodiment, the guide unit further comprises an elastic member positioned between the fixed body and the moving body, and wherein first end of the elastic member is fixed to the second part of the fixed body, and second end of the elastic member is fixed to the moving body, and the moving body moved by the physical contact with the transfer object reverts back to an original position by a restoring force of the elastic member.

In an embodiment, the moving body has a first surface facing a side of a transfer object being transferred, a second surface opposite the first surface, and a third surface connected to the first surface and the second surface, and wherein the angle between third surface and the first surface is greater than 90 degrees.

In an embodiment, the second guide member has a structure same with the first guide member.

In an embodiment, a horizontal cross sectional area of the fixed body is larger than a horizontal cross sectional area of the moving body, and the moving body is disposed over the fixing body such that at least a portion of the fixing body is exposed by the moving body, the exposed portion of the fixing body being adjacent the transfer passage.

In an embodiment, at least a part of the transfer object pass through over the part of the fixed body exposed by the moving body.

The inventive concept provides a die bonding apparatus. The die bonding apparatus includes a cassette configured to store a wafer cut into a plurality of dies or a wafer ring on which the wafer cut into a plurality of dies is attached; a die bonder unit configured to bond a die to a substrate; a transfer unit configured to transfer the wafer or the wafer ring stored at the cassette in the first direction to the die bonder unit; and a guide unit positioned adjacent to the cassette and providing a transfer passage for the wafer or the wafer ring, and wherein the guide unit includes: a first guide member provided with its lengthwise direction in the first direction; and a second guide member provided with its lengthwise direction in the first direction, and spaced apart from the first guide member in a second direction perpendicular to the first direction when seen from above and spaced apart from the first guide member, the first guide member and the second guide member defining the transfer passage therebetween, and wherein the first guide member is movable such that a width of the transfer passage is changeable by the movement of the at least a portion of the first guide member.

In an embodiment, the first guide member includes: a fixed body; and a moving body hinged to the fixed body, the moving body being the at least a portion of the first guide member and being movable by a physical contact with the transfer object and wherein the moving body is provided rotatably movable with respect to the fixed body around an axis of a hinge.

In an embodiment, the first guide member includes: a fixed body; and a moving body coupled to the fixed body, the moving body being the at least a portion of the first guide member and being movable by a physical contact with the transfer object and wherein the moving body is movable in a second direction perpendicular to the first direction with respect to the fixed body, and the moving body moves in a direction away from the wafer or the wafer ring by a physical contact with the wafer or the wafer ring.

In an embodiment, a guide unit configured to guide a transfer object being transferred in a first direction from a cassette storing the transfer object to a target position is included. The guide unit includes: a first guide member provided with its lengthwise direction in the first direction; and a second guide member provided with its lengthwise direction in the first direction, and spaced apart from the first guide member in a second direction perpendicular to the first direction when seen from above and spaced apart from the first guide member, the first guide member and the second guide member defining a transfer passage therebetween, and wherein the first guide member includes a body moving in a direction away from the transfer object with respect to an axis of the first direction by a physical contact with the transfer object during a transfer of the transfer object.

In an embodiment, the body includes: a moving body movable by a physical contact with the transfer object; a fixed body coupled to the moving body; and an elastic member having first end fixed to the fixed body and second end fixed to the moving body, and wherein the moving body moved by the physical contact with the transfer object reverts back to an original position by a restoring force of the elastic member.

According to an embodiment of the inventive concept, a guide unit capable of preventing a wafer ring from being caught in a structure such as a guide member or a wall surface of a cassette during a transfer of the wafer ring within a die bonding apparatus, and a transfer assembly and a die bonding apparatus including the same may be provided.

According to an embodiment of the inventive concept, a guide unit capable of correcting an alignment of a wafer ring even if the wafer ring is loaded or is transferred while being loaded on a cassette in a horizontal state or in an incorrect position, and a transfer assembly and a die bonding apparatus including the same may be provided.

According to an embodiment of the inventive concept, it is possible to minimize a load imposed on a gripper to prevent the gripper from releasing the wafer ring.

According to an embodiment of the inventive concept, it is possible to prevent an occurrence of a transfer failure error of a wafer ring and to minimize a process delay problem.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
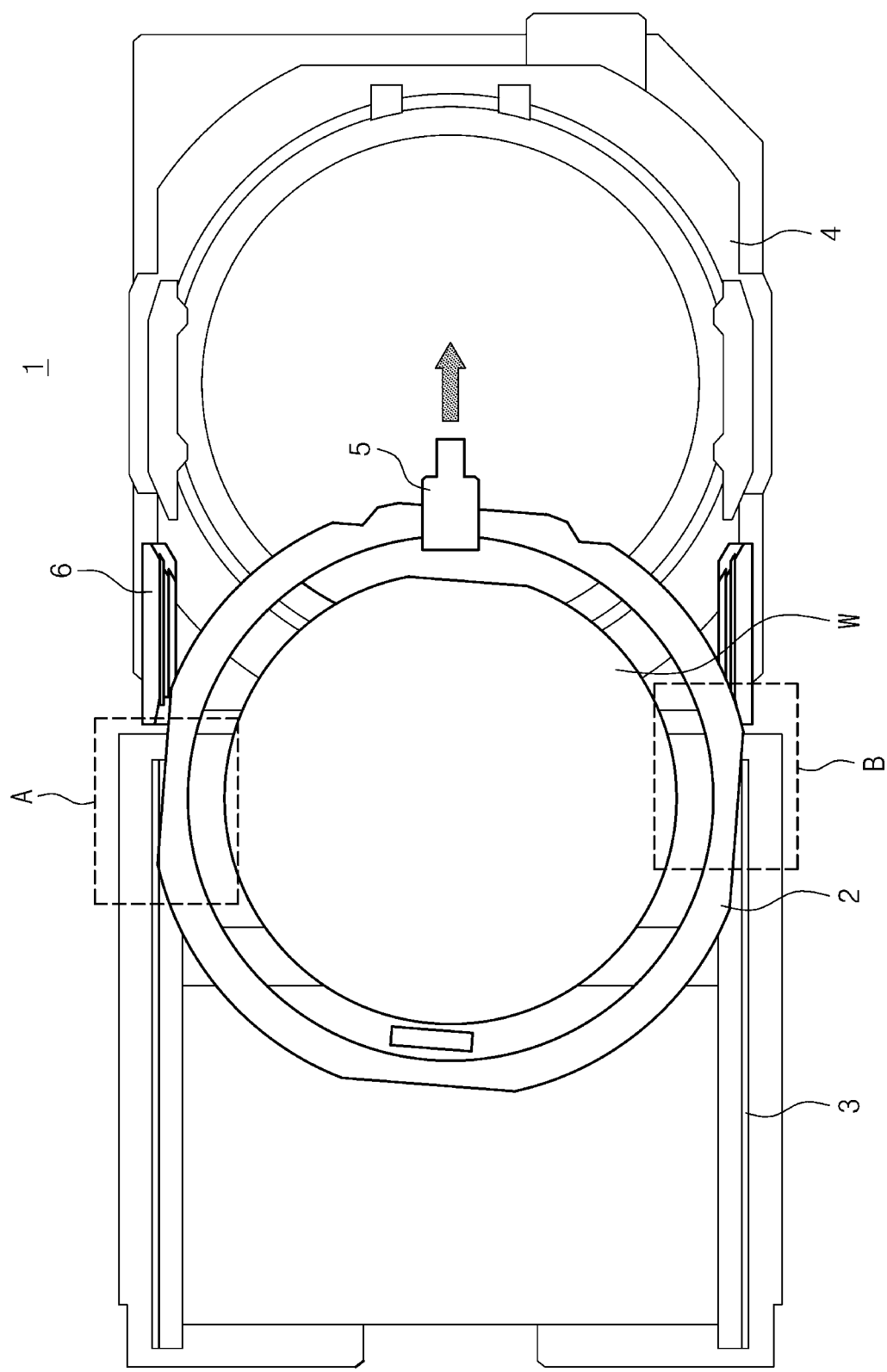
FIG. 1 is a plan view schematically illustrating a conventional die bonding apparatus.
Figure 2:
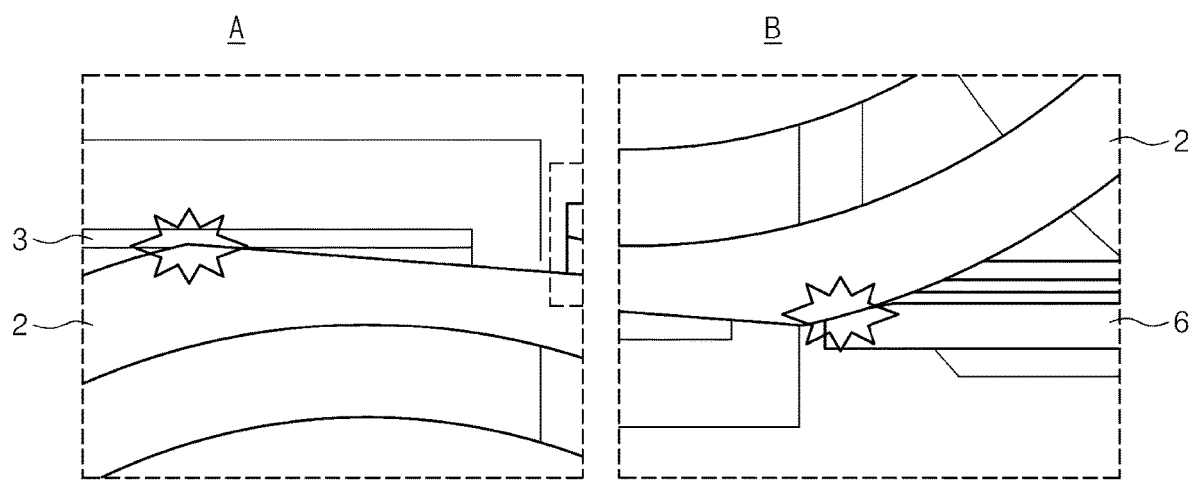
FIG. 2 is an enlarged view illustrating part A and part B of FIG. 1.

Some detailed example embodiments are disclosed herein. However, specific structural and functional details disclosed herein are merely representative for purposes of describing example embodiments. Example embodiments may, however, be embodied in many alternate forms and should not be construed as limited to only the example embodiments set forth herein.

Accordingly, while example embodiments are capable of various modifications and alternative forms, example embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives thereof. Like numbers refer to like elements throughout the description of the figures.

It should be understood that when an element or layer is referred to as being "on," "connected to," "coupled to," "attached to," "adjacent to," "covering," etc. another element or layer, it may be directly on, connected to, coupled to, attached to, adjacent to, covering, etc. the other element or layer or intervening elements or layers may be present. In contrast, when an element is referred to as being "directly on," "directly connected to," "directly coupled to," etc. another element or layer, there are no intervening elements or layers present. Like numbers refer to like elements throughout the specification. As used herein, the term "and/or" includes any and all combinations or sub-combinations of one or more of the associated listed items.

It should be understood that, although the terms first, second, third, etc. may be used herein to describe various elements, regions, layers and/or sections, these elements, regions, layers, and/or sections should not be limited by these terms. These terms are only used to distinguish one element, region, layer, or section from another region, layer, or section. Thus, a first element, region, layer, or section discussed below could be termed a second element, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various example embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, and/or elements, but do not preclude the presence or addition of one or more other features, integers, steps, operations, elements, and/or groups thereof.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, a die bonder according to an embodiment of the inventive concept will be described in more detail according to the accompanying drawings.

Figure 3:
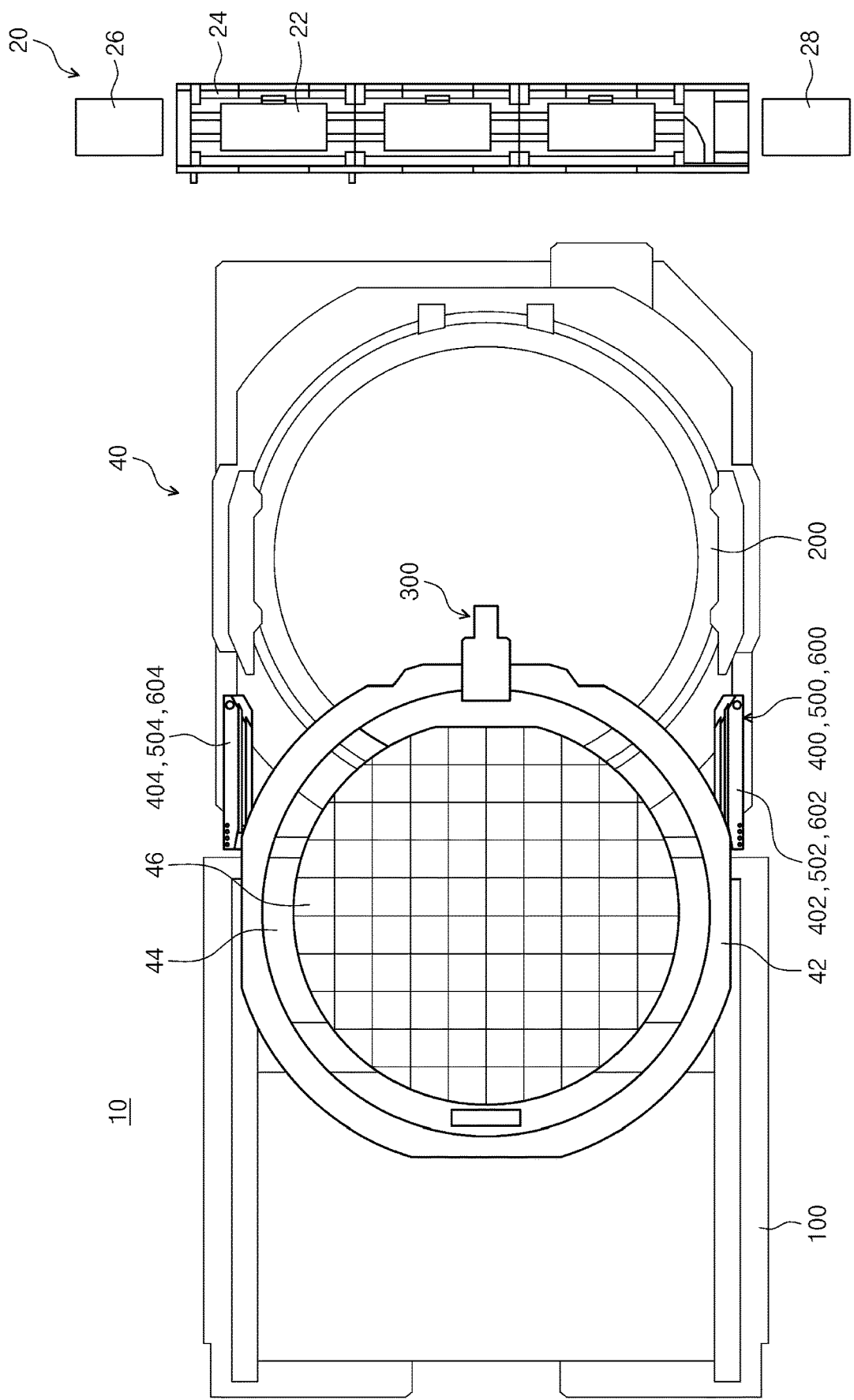
FIG. 3 is a plan view of a die bonding apparatus according to the inventive concept.

FIG. 3 is a plan view of a die bonding apparatus according to the inventive concept.

The die bonding apparatus 10 is an apparatus used in a die bonding process including attaching a die (individualized chip through a sawing process) to a lead frame or a board (e.g., printed circuit board (PCB) using an adhesive material such as an epoxy or a tape. The die bonding apparatus 10 is largely divided into a wafer logistics related to a movement of wafers, an index logistics related to a movement of lead frames or boards, and a die logistics related to a movement of each die. The inventive concept relates to the wafer type among these. In the die bonding apparatus 10, the wafer logistics refers to a loading of a wafer, an unloading of the wafer, and/or a planar motion. For example, the loading of the wafer may be a mechanism to transfer a wafer loaded on a cassette 100 to the transfer assembly 300 to seat on the die bonder unit 200. Also, the unloading of the wafer may be a mechanism to transfer a wafer seated on the die bonder unit to the cassette 100. Also, the planar motion may be a stretching and an expanding of a wafer ring seated on the die bonder unit 200 during a die attach process. In this case, the die bonder unit 200 may be referred to as an expander 200.

The die bonding apparatus 10 according to the inventive concept includes a board moving unit 20 for transferring a lead frame or a printed circuit board (PCB), a wafer moving unit 40 related to a movement of the wafer for determining a position of a die to be loaded, unloaded, or picked-up, and a die moving unit (not shown) related to die attach including picking up a die from a wafer to attach to a lead frame or PCB.

The substrate moving unit 20 includes an index rail 24 on which the board or the lead frame 22 is mounted and transferred, a substrate supply box 26 disposed at first end of the index rail 24 to hold board or lead frame 22 to be loaded on the index rail 24, and a substrate storage box 28 disposed at second end of the index rail 24 to hold board or lead frame on which a die bonding process is completed. The board or lead frame 22 is loaded from the substrate supply box 26 to the index rail 24, moves along the index rail 24, and a die is attached at a working position, and the board or lead frames 22 on which a die bonding process has been completed are loaded from the index rail 24 to the substrate supply box 28.

The wafer moving unit 40 includes a cassette 100 for vertically receiving the transfer object at regular intervals, an expander 200 for performing a movement for picking up the die by seating the transfer object, a transfer unit 300 for transferring the transfer object loaded in the cassette 100 to the expander 200, and a guide units 400, 500, and 600 for guiding a movement of the transfer object. The wafer moving unit 40 may include a rolling member (not shown) disposed between the cassette 100 and the expander 200. A bottom surface of the transfer object transferred from the cassette 100 to the expander 200 may be placed on the rolling member. The rolling member may be positioned below the guide units 400, 500, and 600. In this case, the transfer object includes a wafer 44 cut into a plurality of dies 46 or a wafer ring 42 to which the wafer 4 is bonded. An outer circumferential portion of the wafer sheet is attached to the wafer ring 42/, and the wafer 44 comprising a plurality of dies 46 is adhered to the wafer sheet. A plurality of transfer objects are loaded on the cassette 100. The plurality of transfer object objects are stacked at predetermined intervals in the up/down direction in the cassette 100. The cassette 100 may include an elevator (not shown). The elevator may be mounted on a side of the cassette 100 to move the transfer object loaded on the cassette 100 in the up/down direction.

The expander 200 is positioned at a receiving port side of the cassette 100 so that the transfer object may be transferred to the expander 200. The expander 200 may perform a planar motion in any one of the X-axis direction or the Y-axis direction. In an embodiment, for receiving the transfer object from the cassette 100, the expander 200 may be linearly moved to be adjacent to the receiving port of the cassette 100. In addition, when the expander 200 moves the transfer object for pickup of the die 46 on the wafer 44, the expander 200 may perform a planar motion of stretching and expanding the transfer object. The expander 200 may move in a plane according to a pickup position of the die 46 on the wafer 44.

The transfer assembly 300 transfers the transfer object in a direction from the cassette 100 toward the expander 200. In this case, a direction from the cassette 100 to the expander 200 is referred to as a first direction. The transfer assembly 300 transfers the transfer object stored in the cassette 100 to a target position. In this case, the target position may be a seating surface of the expander 200. The transfer assembly 300 may linearly move the transfer object to the expander 200. The transfer assembly 300 includes a transfer robot which takes out the transfer object stored at the cassette 100 and transfers the object to the target position along the first direction. The transfer robot includes a gripper holding the transfer object, a transfer rail supporting and moving the gripper, and a driving unit can drive the transfer rail. The gripper grips the transfer object during a loading and an unloading of the transfer object. The gripper grips an outer circumferential portion of the transfer object. In an embodiment, the gripper may grip an outer circumferential portion of the wafer ring 42. The transfer rail extends parallel to the Y-axis direction from the cassette 100 toward the expander 200. The driving unit provides a driving force to the transfer rail. The driving unit may include a motor.

The guide units 400, 500, and 600 provide a transfer passage through which the transfer object is transferred. The guide units 400, 500, and 600 guide a movement of the transfer object when the transfer object is transferred. The guide units 400, 500, and 600 guide a linear moving path of the transfer object so as not to deviate from a correct position when the transfer object is moved in a linear line. The guide units 400, 500, and 600 are disposed between the cassette 100 and the expander 200. The guide units 400, 500, and 600 are provided between the cassette 100 and the expander 200 to constrain a position of the transfer object when the transfer object loaded on the cassette 100 is being transferred back to the expander 200. The guide units 400, 500, and 600 may support a side of the transfer object. At least a portion of the guide units 400, 500, and 600 overlaps the transfer object in a second direction perpendicular to the first direction. If the transfer object is transferred while maintaining a correct position by the transfer assembly 300, the transfer object is transferred while being spaced apart from the guide units 400, 500, and 600 at a predetermined interval. If that the transfer object is transferred back without maintaining the correct position, the transfer object may be in contact with the guide units 400, 500, and 600. In this case, the guide units 400, 500, and 600 may support a side of the transfer object to guide a moving path of the transfer object.

If the transfer object is horizontally loaded within the cassette 100 or if the transfer object is held by the transfer assembly 300 in a horizontal state or held maintaining a correct position, the transfer object is transferred to the expander 200 while maintaining a predetermined separation distance from the guide units 400, 500, and 600. However, in the case the load state of the transfer object is poor or the transfer object is held in a non-horizontal state by the transfer assembly 300, the transfer object may collide with or be caught in a structure such as the guide units 400, 500, 600, or a wall of the cassette 100.

Hereinafter, the guide unit 400 according to the first embodiment of the inventive concept will be described in detail with reference to the drawings.

Figure 4:
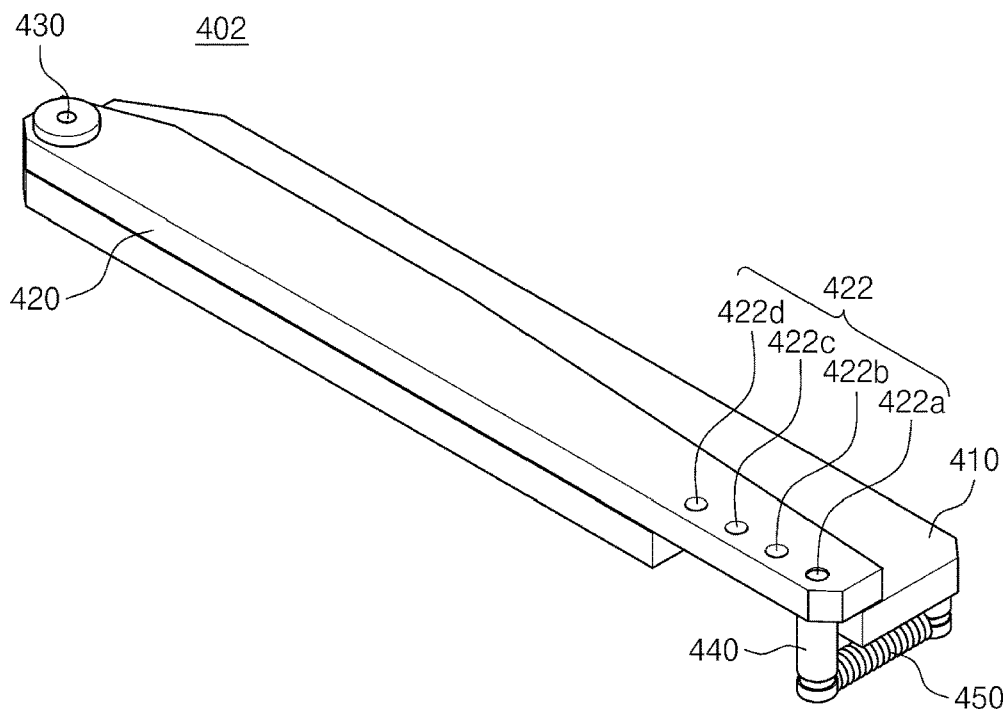
FIG. 4 is a perspective view of a guide unit according to a first embodiment of the inventive concept.
Figure 5:
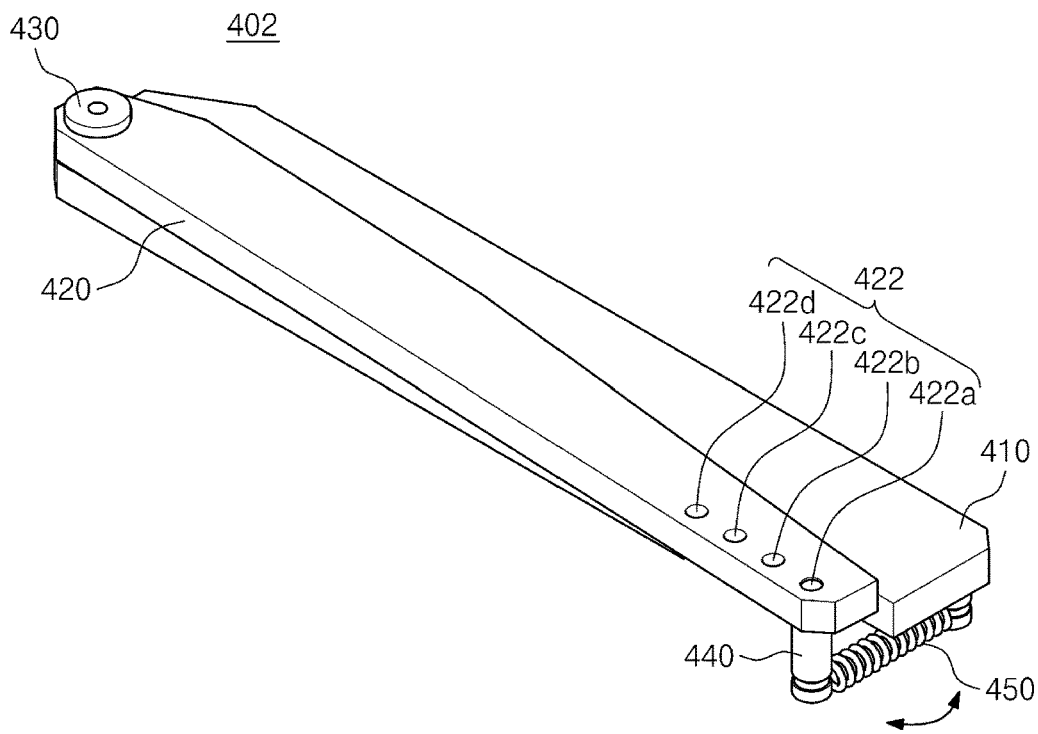
FIGS. 5 and 6 are operation views illustrating an operation process of the guide unit according to the first embodiment of the inventive concept.
Figure 6:
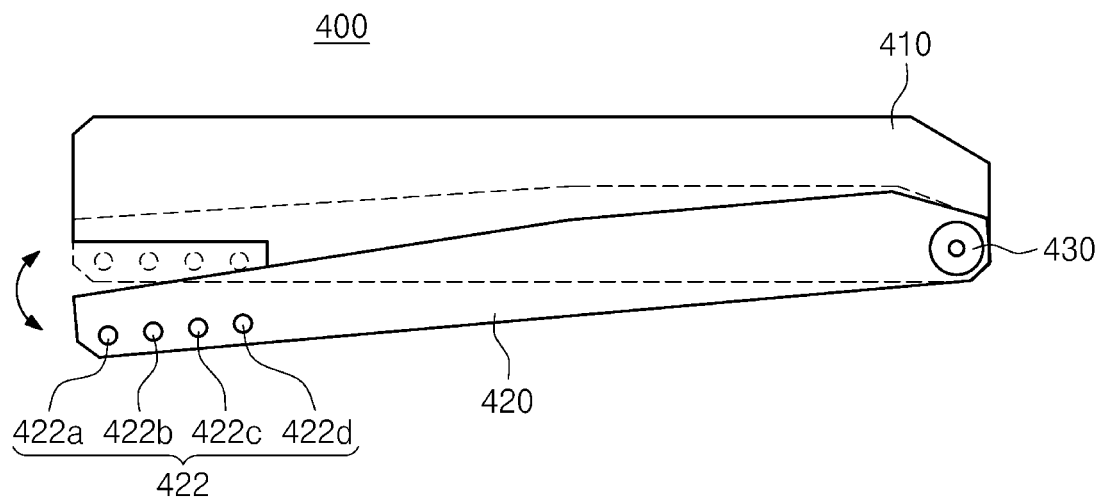
Figure 7A:
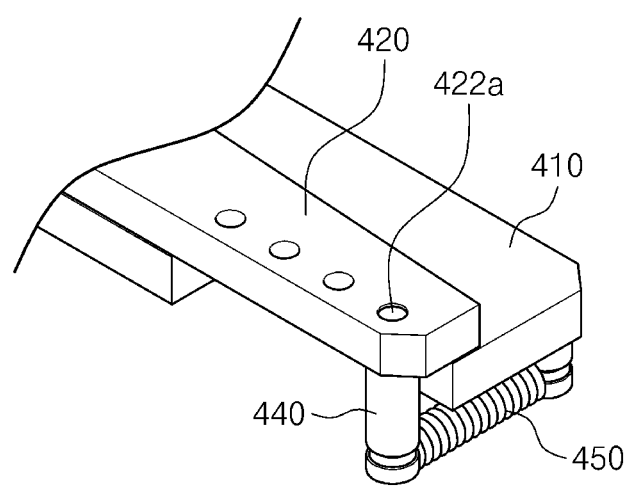
FIG. 7A to FIG. 7D illustrate a position of a pin member of the guide unit according to the first embodiment of the inventive concept.
Figure 7B:
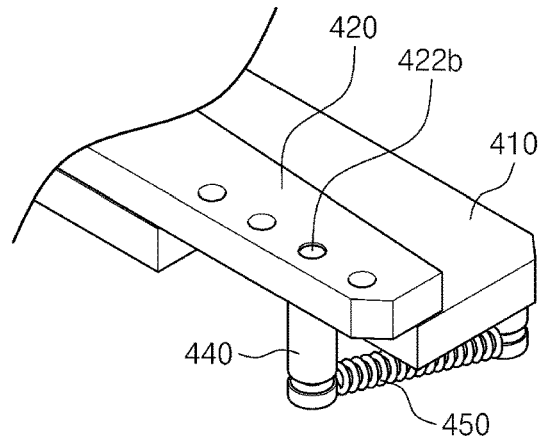
Figure 7C:
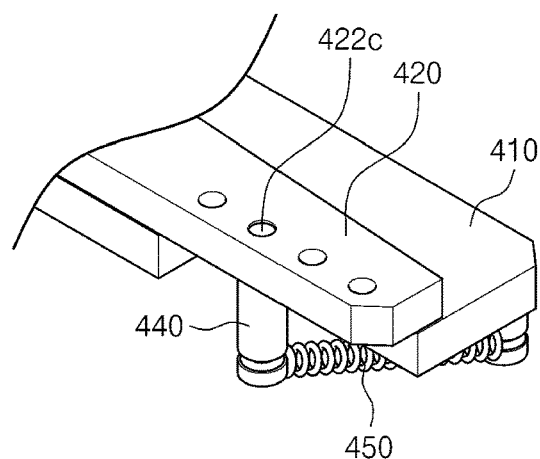
Figure 7D:
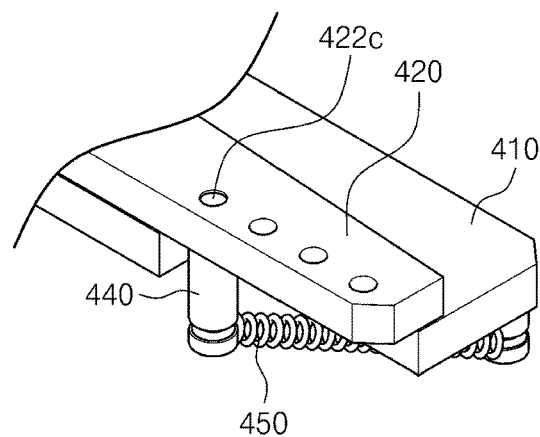
Figure 8:
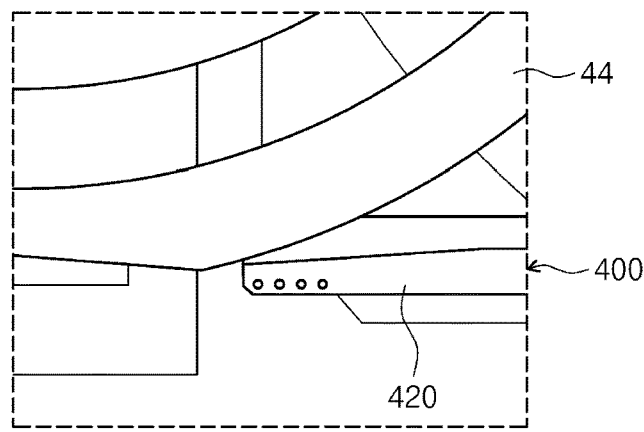
FIG. 8 to FIG. 10 schematically illustrate a relationship between the guide unit and a transfer object when the guide unit according to the first embodiment of the inventive concept comes into contact with the transfer object.
Figure 9:
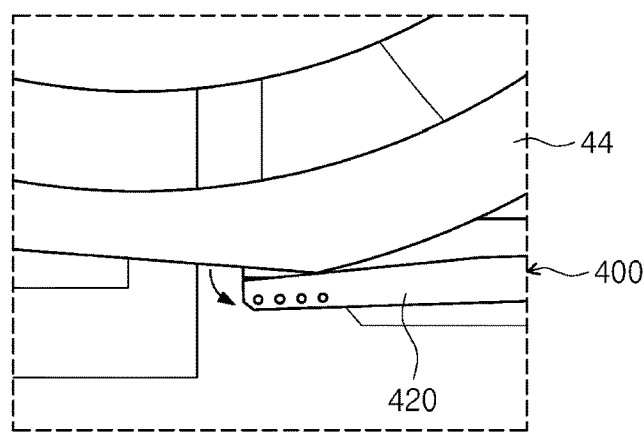
Figure 10:
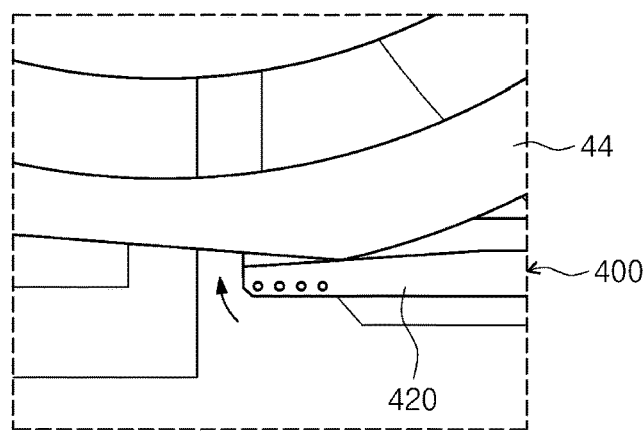

FIG. 4 is a perspective view of the guide unit according to a first embodiment of the inventive concept, FIG. 5 and FIG. 6 are operation views of the guide unit according to the first embodiment of the inventive concept, FIG. 7A to FIG. 7D are illustrate a position of a pin member of the guide unit according to the first embodiment of the inventive concept, and FIG. 8 to FIG. 10 schematically illustrate a relationship between the guide unit and the transport object when the guide unit contacts the transport object.

The guide unit 400 includes a plurality of guide members. In an embodiment, the guide unit 400 may include a first guide member 402 and a second guide member 404. However, the inventive concept is not limited thereto, and may include one guide member or three or more guide members as necessary. The guide unit 400 is positioned adjacent to the cassette 100.

A lengthwise direction of the first guide member 402 is provided in the first direction. A lengthwise direction of the second guide member 404 is provided in the first direction. The first guide member 402 and the second guide member 404 are disposed to be spaced apart from each other in the second direction perpendicular to the first direction when viewed from above. The second guide member 404 faces the first guide member 402. The first guide member 402 and the second guide member 404 provides a transfer passage therebetween. The transfer object is transferred through the transfer passage between the first guide member 402 and the second guide member 404.

The first guide member 402 and the second guide member 404 have the same shape. Hereinafter, a structure of the first guide member 402 will be described in detail.

The first guide member 402 is provided to be movable so that a width of the transfer passage may be changed by a physical contact with the transfer object. In this case, the width of the transfer passage refers to a distance in the second direction between the first guide member 402 and the second guide member 404.

The first guide member 402 includes a fixed body 410 and a moving body 420 hinged to the fixed body 410. The moving body 420 is disposed over the fixed body 410. For example, at least a portion of the fixed body 410 is exposed by the moving body 420, In an embodiment, a horizontal cross-sectional area of the fixed body 410 is provided to be larger than a horizontal cross-sectional area of the moving body 420. A portion of the fixed body 410 exposed by the moving body 420 may contact and support at least a portion of the transfer object. Alternatively, a portion of the fixed body 410 exposed by the moving body 420 may not contact the transfer object during transfer.

The moving body 420 is provided to be movable with respect to the fixed body 410. The movement of the moving body 420 may increase the exposed area of the fixing body 410 by the moving body 420. The moving body 420 is rotatably coupled to the fixed body 410. The moving body 420 is pivotally coupled to the fixed body 410. The moving body 420 is provided to be rotatable with respect to the fixed body 410 around a hinge shaft 430. The moving body 420 and the fixed body 410 are hinged on the hinge shaft 430. The moving body 420 is hinged to the fixed body 410 at a position where first end of the moving body 420 and first end of the fixed body 410 overlap. That is, the hinge shaft 430 is provided at a position where the first end of the moving body 420 and the first end of the fixed body 410 overlap. The moving body 420 and the fixed body 410 are pin-coupled to each other at the hinge shaft 430. A pin for coupling the fixed body 410 and the moving body 420 may be provided at the hinge shaft 430.

An inner surface of the moving body 420 facing the transfer object may include an inclined surface along the lengthwise direction (i.e., the first direction), e.g., the inner surface of the moving body 420 is not parallel with the first direction. At least a portion of the inner surface of the moving body 420 may be provided as an inclined surface along the first direction. A region of the inner surface of the moving body 420 adjacent to the cassette 100 may be provided to be inclined. This is to guide the moving path of the transfer object when the transfer object contacts the moving body 420.

The first guide member 402 includes an elastic member 450. The elastic member 450 is provided between the fixed body 410 and the moving body 420. The second end of the fixed body 410 opposite the first end thereof and the second end of the moving body 420 opposite the first end thereof may be coupled to each other by the elastic member 450. The elastic member 450 may constrain a rotational movement range of the second end of the moving body 420. The elastic member 450 provides a restoring force to the moving body 420 moved by an external force (e.g., by a physical contact with the transfer object). The moving body 420 is moved by a physical contact with the transfer object and then returned to an original position by the restoring force of the elastic member 450. The elastic member 450 may include a compression coil spring.

A hole 422 is formed at the moving body 420. The hole 422 is formed at the second end of the moving body 420. A plurality of holes 422 may be formed. In an embodiment, the plurality of holes 422 may include first holes to fourth holes 422a, 422b, 422c, and 422d. The plurality of holes 422 are arranged along a lengthwise direction (i.e., the first direction) of the moving body 420. The plurality of holes 422 are arranged in a direction along the first direction. The moving body 420 includes a pin member 440 selectively coupled to any one of the plurality of holes 422. One end of the elastic member 450 is fixed to the pin member 440 of the moving body 420, and the other end of the elastic member 450 is fixed to the fixed body 410.

A rigidity of the elastic member 450 varies depending on a coupling position to the moving body 420. The rigidity of the elastic member 450 varies according to a position of the pin member 440. Referring to FIG. 7A to FIG. 7D, the pin member 440 may be selectively coupled to any one of the first holes to fourth holes 422a, 422b, 422c, and 422d. The first hole 422a is formed at a position closer to the other end of the top body 420 than the second holes to third holes 422b, 422c, and 422d. The fourth hole 422d is formed at a position closer to the first end of the moving body 420 than the first holes to third holes 422a, 422b, and 422c. The second hole 422b is formed closer to the first hole 422a than the third hole 422c. The third hole 422c is formed between the second hole 422c and the fourth hole 422d. The rigidity of the elastic member 450 may be greater when the pin member 440 is coupled to the fourth hole 422d than when the pin member 440 is coupled to the first hole 422a. That is, the rigidity of the elastic member 450 increases as the coupling position moves from the first hole 422a to the fourth hole 422d, and the rigidity of the elastic member 450 decreases as the coupling position moves from the fourth hole 422d to the first hole 422a. When the rigidity of the elastic member 450 is increased, a rotational movement range of the second end of the top body 420 may be reduced. When the rigidity of the elastic member 450 is increased, the restoring force applied by the elastic member 450 to the top body 420 is increased, and thus an alignment of the transfer object may be facilitated. When the rigidity of the elastic member 450 is reduced, an impact absorption may be easily performed when the wafer 44 or the wafer ring 42 collides with the guide member 400.

Although the holes 422 formed at the moving body 420 are illustrated as including four holes 422a, 422b, 422c, and 422d, the inventive concept is not limited thereto, and the number of holes 422 may be adjusted according to a type of elastic member 450 or a rigidity required for a restoring force.

An inner surface of the moving body 420 faces a side of the transfer object held by the transfer assembly 300. When the transfer object is loaded in the cassette 100 in a biased or rotated state and is transferred in a state that is not maintained in a horizontal state, the side of the transfer object may contact the inner surface of the moving body 420. The moving body 420 is then moved in a direction away from the transfer object with respect to an axis in the first direction by contact with the transfer object.

When the transfer object is horizontally loaded in the cassette 100 or held in a horizontal state or in a correct position by the transfer assembly 300, the transfer object is transferred to and seated in the expander 200 while maintaining a predetermined distance from the guide unit 400. However, if a loading state of the transfer object is poor or the transfer object is held in a state that is not horizontally maintained, the transfer object may collide with or be caught in structures such as the guide unit 400 and a wall of the cassette 100. Referring to FIG. 8 to FIG. 10, the transfer object is biased to one side or is transferred in a rotated state, so that it can be in contact with the inner surface of the moving body 420. In this case, as the moving body 420 is rotated and moved around the hinge shaft 430 with respect to the fixed body 410, the transfer object is prevented from being caught in structures such as a wall surface of the guide unit 400 and the cassette 100. Accordingly, an overloading of the gripper of the transfer assembly 300 is prevented. The moving body 420 rotated and moved in a direction away from the transfer object due to contact with the transfer object is returned to its original position by the restoring force of the elastic member 450. In this process, the moving body 420 pushes a side of the transfer object, and a twisted transfer object is restored to its correct position. Accordingly, an alignment of a seating position of the transfer object in the expander 200 may be improved.

Hereinafter, the guide unit 500 according to a second embodiment of the inventive concept will be described in detail with reference to the drawings.

Figure 11:
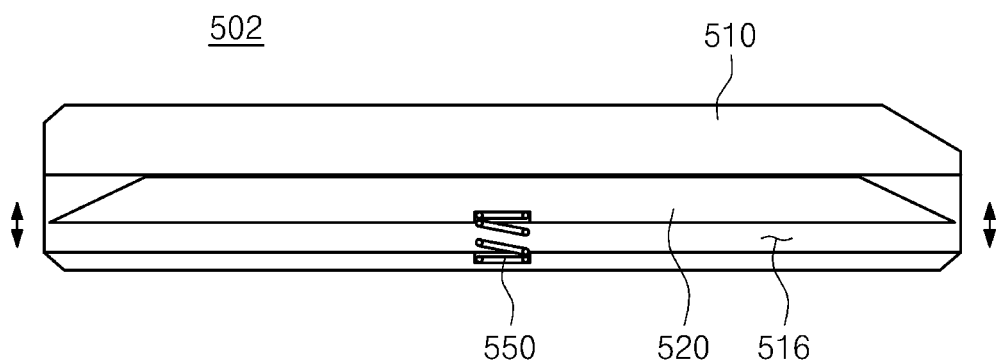
FIG. 11 is a plan view of the guide unit according to a second embodiment of the inventive concept.
Figure 12:
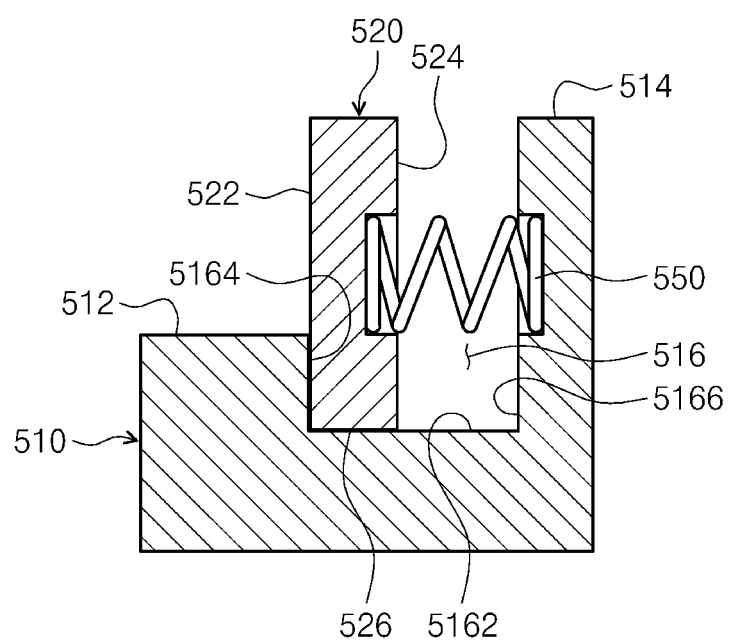
FIG. 12 is a side view of the guide unit according to the second embodiment of the inventive concept.
Figure 13:
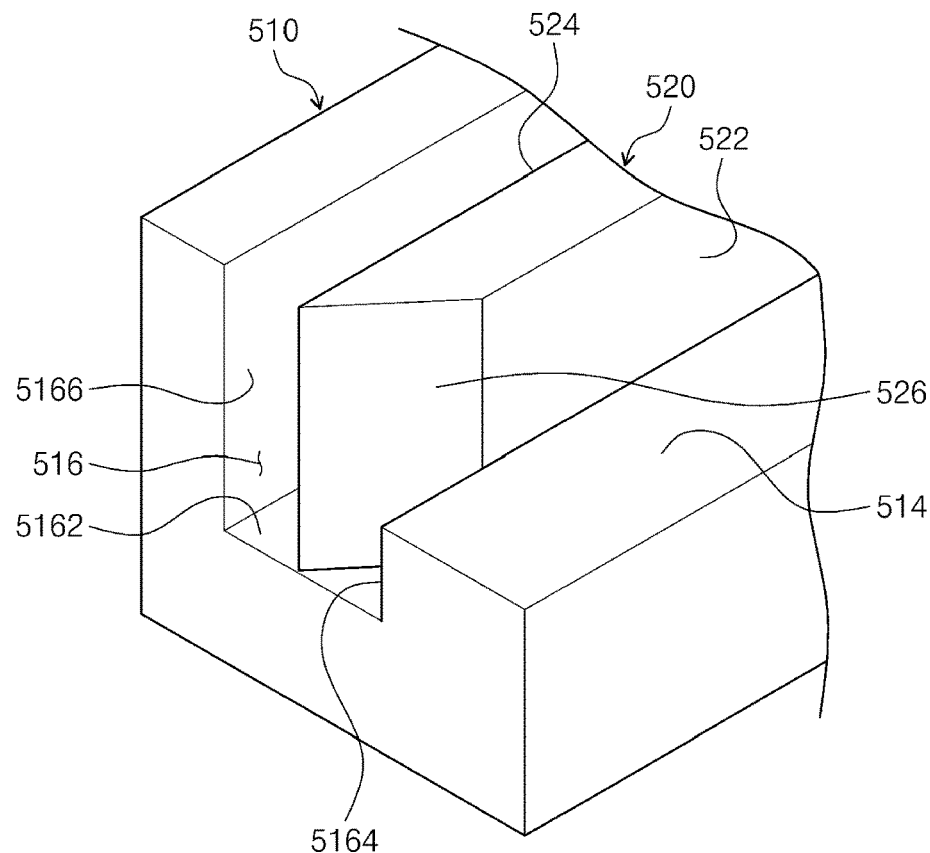
FIG. 13 is a perspective view of the guide unit according to the second embodiment of the inventive concept.
Figure 14:
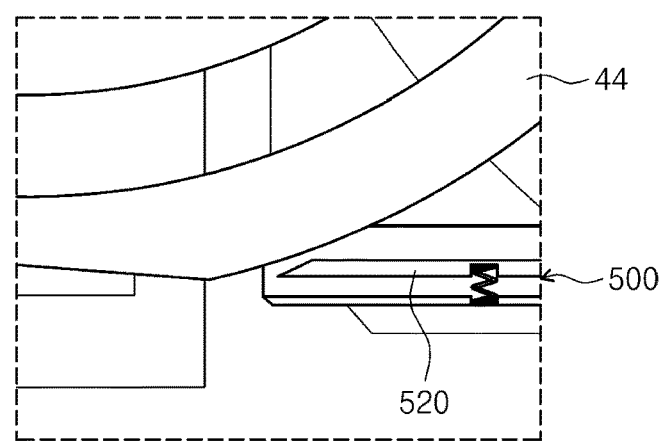
FIG. 14 to FIG. 16 schematically illustrate the relationship between the guide unit and the transfer object the guide unit according to the second embodiment of the inventive concept comes into contact with the transfer object.
Figure 15:
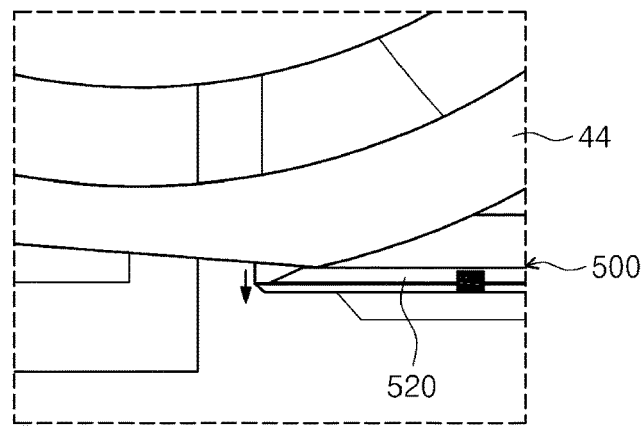
Figure 16:
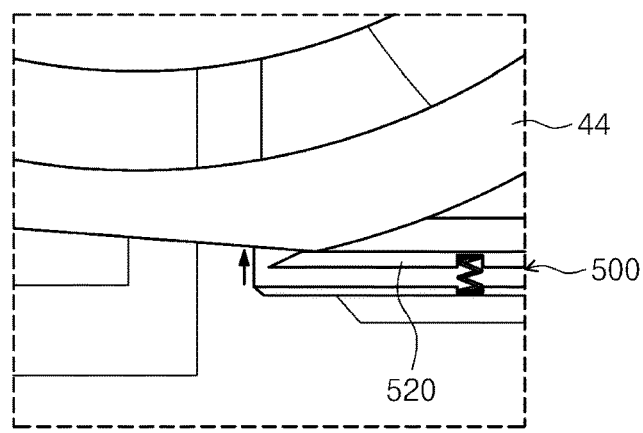
Figure 17:
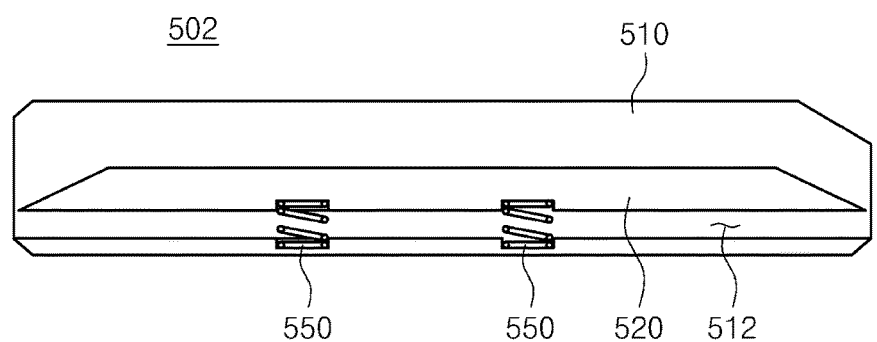
FIG. 17 is a plan view of the guide unit according to a modified embodiment of the second embodiment of the inventive concept.

FIG. 11 is a plan view of a guide unit according to the second embodiment of the inventive concept, FIG. 12 is a side view of the guide unit according to the second embodiment of the inventive concept, FIG. 13 is a perspective view of the guide unit according to the second embodiment of the inventive concept, FIG. 14 to FIG. 16 schematically illustrate a relationship between the guide unit and the transport object when the guide unit according to the second embodiment of the inventive concept comes into contact with the transport object, and FIG. 17 is a plan view of the guide unit according to a modified example of the second embodiment of the inventive concept.

The guide unit 500 according to the second embodiment includes a plurality of guide members. In an embodiment, the guide unit 500 may include a first guide member 502 and a second guide member 504. However, the inventive concept is not limited thereto, and may include one guide member or three or more guide members as necessary. The guide unit 500 is positioned adjacent to the cassette 100.

A lengthwise direction of the first guide member 502 is provided in the first direction. A lengthwise direction of the second guide member 504 is provided in the first direction. The first guide member 502 and the second guide member 504 are disposed to be spaced apart from each other in the second direction perpendicular to the first direction when viewed from above. The second guide member 504 faces the first guide member 502. The first guide member 502 and the second guide member 504 provides a transfer passage therebetween for the transfer object. The transfer object is transferred between the first guide member 502 and the second guide member 504.

The first guide member 502 and the second guide member 504 may have the same structure and shape. Hereinafter, a structure of the first guide member 502 will be described in detail.

The first guide member 502 is provided to be movable so that a width of the transfer passage may be changed by an external force e.g., by physical contact with the transfer object. In this case, the width of the transfer passage refers to a distance in the second direction between the first guide member 502 and the second guide member 504.

The first guide member 502 includes a fixed body 510 and a moving body 520 coupled to the fixed body 510. The moving body 520 is disposed over the fixed body 510. The moving body 520 is provided to be movable with respect to the fixed body 510. Hereinafter, a description of a configuration overlapping the first guide member 402 according to the first embodiment will be omitted, and a configuration having a difference will be mainly described.

The moving body 520 is provided to be horizontally movable with respect to the fixed body 510. The moving body 520 is provided to be linearly movable with respect to the fixed body 510. The moving body 520 is provided to be linearly moved (e.g., parallel transference) in the second direction perpendicular to the first direction with respect to the fixed body 510. The moving body 520 may be moved away from the transfer object by physical contact with the transfer object.

The fixed body 510 includes a first part with a first top surface 512, a second part with a second top surface 514, and a groove 516 defined between the first and second 0top surfaces 512 and 514. The second top surface 514 is formed to be stepped from the first top surface 512. The second top surface 514 is positioned higher than the first top surface 512. The groove 516 may be downwardly recessed from at least a portion of the first top surface 512 of the fixed body 510. The groove 516 includes a bottom surface 5162, a first side surface 5164 connecting the bottom surface 5162 and the first top surface 512, and a second side surface 5166 connecting the bottom surface 5162 and the second top surface 514 and facing the first side surface 5164. The moving body 520 is disposed at a portion of the groove 516. A lower end portion of the moving body 520 is disposed at the groove 516. The moving body 520 is horizontally moved or linearly moved within the groove 516. The moving body 520 is provided to be movable in the second direction within the groove 516. The groove 516 guides a horizontal movement of the moving body 520. The groove 516 constrains a horizontal movement range of the moving body 520.

The moving body 520 includes a first surface 522 facing the first side surface 5164 of the groove 516, a second surface 524 facing the second side surface 5166 of the groove 516, and a third surface 526 connecting the first surface 522 and the second surface 524. The first surface 522 faces a side portion of the transfer object being transferred. A length of the first surface 522 in the first direction is shorter than a length of the second surface 524 in the first direction. An area of the first surface 522 is provided to be smaller than an area of the second surface 524. The second surface 524 is disposed on an opposite side of the first surface 522. The third surface 526 is provided as an inclined surface, e.g., not parallel with a plane perpendicular to the first direction (moving direction of the transfer object). The third surface 526 is provided to be inclined in a direction from the first surface 522 toward the second surface 524 such that the angle between the third surface 526 and the second surface 524 is greater than 90 degrees. A length of the moving body 520 in the first direction is provided to be longer toward the second surface 524 from the first surface 522. As the third surface 526 is provided as an inclined surface, when the transfer object contacts the moving body 520, a moving path of the transfer object may be guided.

The first guide member 502 includes an elastic member 550. The elastic member 550 is provided between the moving body 520 and the fixed body 510. The elastic member 550 is provided between the second surface 524 of the moving body 520 and the second side surface 5166 of the groove 516 of the fixed body 510. An end of the elastic member 550 is fixed to the fixed body 510, and the other end of the elastic member 550 is fixed to the moving body 520. The moving body 520 is movably coupled to the fixed body 510 by the elastic member 550. The elastic member 550 may constrain a linear movement range of the moving body 520. The elastic member 550 provides a restoring force to a moved moving body 520. A position of the moving body 520 is moved by a physical contact with the transfer object, and then returned to an original position by the restoring force of the elastic member 550. The elastic member 550 may include a compression coil spring.

Referring to FIG. 17, the elastic member 550 may connect the moving body 520 and the fixed body 510 in one or two locations. When connected at one location, the moving body 520 and the fixed body 510 may be coupled to each other in a central region of the moving body 520 and the fixed body 510. When connected at two locations, the moving body 520 and the fixed body 510 may be coupled to each other at a position spaced apart from each other by a predetermined interval around a central region of the second body 520 and the fixed body 510. In this case, two elastic members 550 may be used. In the above description, one or two elastic members 550 are used, but the inventive concept is not limited thereto, and various numbers may be provided according to a type of elastic member 550, a size of a rigidity of the elastic member 550, and a size of a rigidity required for a restoring force.

When the transfer object is horizontally loaded in the cassette 100 or held in a horizontal state or in a correct position by the transfer assembly 300, the transfer object is transferred to and seated in the expander 200 while maintaining a predetermined distance from the guide unit 500. However, if a load state of the transfer object is poor or the transfer object is held in a state that is not horizontally maintained, the transfer object may collide with or be caught in a structure such as a guide unit 500 or a wall surface of the cassette 100. Referring to FIG. 14 to FIG. 16, the transfer object is transferred in a biased or rotated state and may be in contact with a first surface 522 of the moving body 520. In this case, as the moving body 520 is linearly moved away from the transfer object with respect to the fixed body 510, the transfer object is prevented from being caught in a structure such as a wall surface of the guide unit 500 and the cassette 100. Accordingly, it is possible to prevent an overload from occurring in the gripper of the transfer assembly 300. A moving body 520 moved linearly in a direction away from the transfer object due to a contact with the transfer object reverts to its original position by a restoring force of the elastic member 550. In this process, the moving body 520 pushes a side of the transfer object, and a twisted transfer object is restored to its correct position. Accordingly, an alignment at a seating position of the transfer object in the expander 200 may be improved.

Hereinafter, the guide unit 600 according to a third embodiment of the inventive concept will be described in detail with reference to the drawings.

Figure 18:
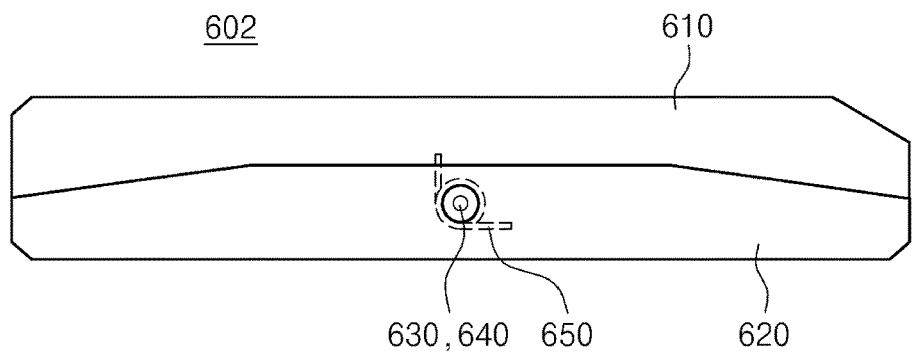
FIG. 18 is a plan view of the guide unit according to the third embodiment of the inventive concept.
Figure 19:
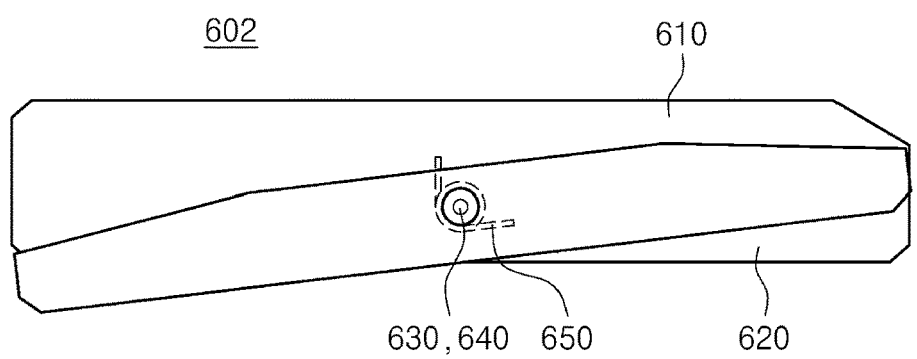
FIG. 19 and FIG. 20 are operation views illustrating the operation process of the guide unit according to the third embodiment of the inventive concept.
Figure 20:
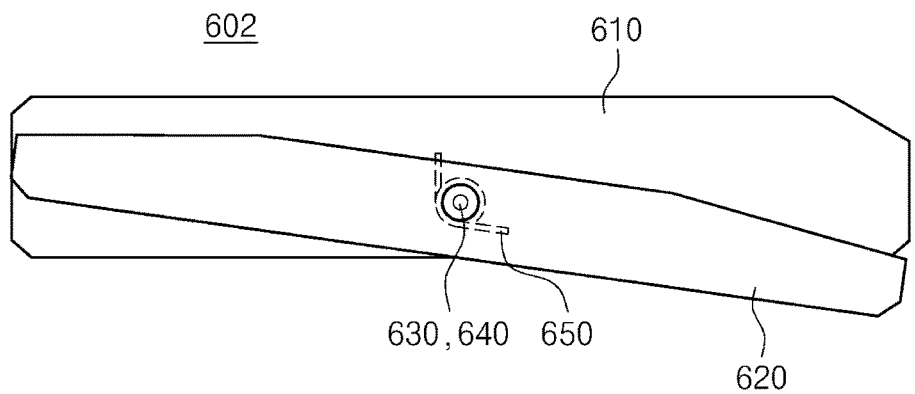
Figure 21:
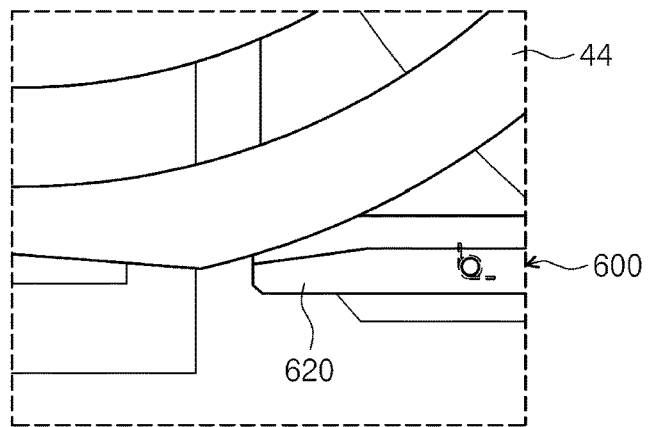
FIG. 21 to FIG. 23 illustrate a relationship between the guide unit and the transfer object when the guide unit in accordance with the third embodiment of the inventive concept comes into contact with the transfer object.
Figure 22:
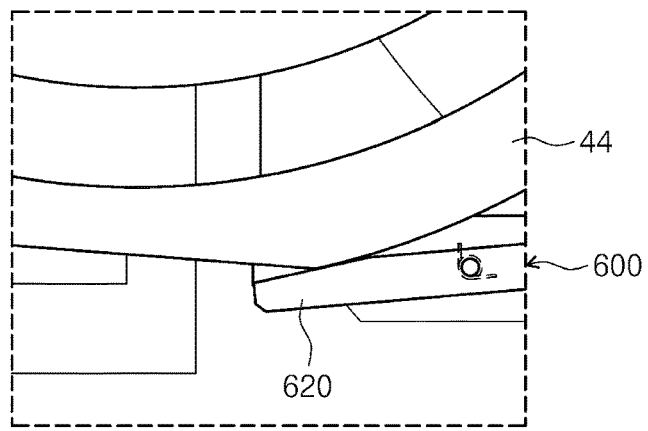
Figure 23:
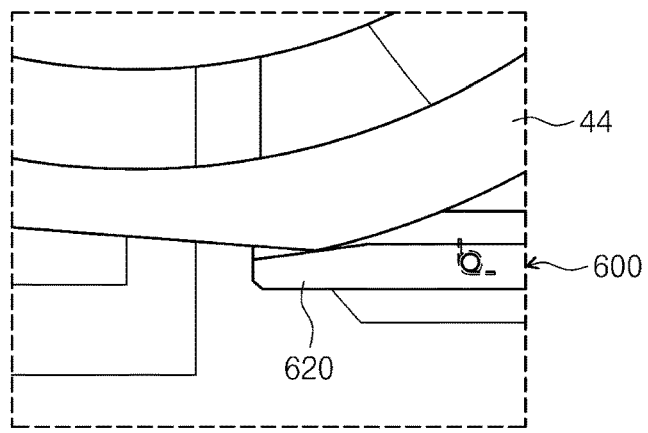

FIG. 18 is a plan view of the guide unit according to the third embodiment of the inventive concept, FIG. 19 and FIG. 20 are operational views of the guide unit according to the third embodiment of the inventive concept, and FIG. 21 to FIG. 23 schematically illustrates a relationship between the guide unit and the transfer object when the guide unit is in contact with the third embodiment of the inventive concept.

The guide unit 600 according to the third embodiment includes a plurality of guide members. In an embodiment, the guide unit 600 may include a first guide member 602 and a second guide member 604. However, the inventive concept is not limited thereto, and may include one guide member or three or more guide members as necessary. The guide unit 600 is positioned adjacent to the cassette 100.

A lengthwise direction of the first guide member 602 is provided in the first direction. A lengthwise direction of the second guide member 604 is provided in the first direction. The first guide member 602 and the second guide member 604 are disposed to be spaced apart from each other in the second direction perpendicular to the first direction when viewed from above. The second guide member 604 faces the first guide member 602. The first guide member 602 and the second guide member 604 provides a transfer passage therebetween for the transfer object. The transfer object is transferred between the first guide member 602 and the second guide member 604.

The first guide member 602 and the second guide member 604 may have the same structure and shape. Hereinafter, a structure of the first guide member 602 will be described in detail.

The first guide member 602 is provided to be movable so that a width of the transfer passage may be changed by physical contact with the transfer object. In this case, the width of the transfer passage refers to a distance in the second direction between the first guide member 602 and the second guide member 604.

The first guide member 602 includes a fixed body 610 and a moving body 620 coupled to the fixed body 610. The moving body 620 is disposed over the fixed body 610. The moving body 620 is provided to be movable with respect to the fixed body 610. Hereinafter, a description of a configuration overlapping the first guide member 402 according to the first embodiment will be omitted, and a configuration having a difference will be mainly described.

The moving body 620 is provided to be movable with respect to the fixed body 610. The moving body 620 is rotatably coupled to the fixed body 610. The moving body 620 is provided to be rotatable with respect to the fixed body 610 around the rotary shaft 630. The moving body 620 and the fixed body 610 are pin-coupled to each other at the rotary shaft 630. The moving body 620 is pin-coupled to the fixed body 610 at a position where a central portion of the moving body 620 and the central portion of the fixed body 610 overlap. That is, the rotary shaft 630 is provided at a position where an end of the moving body 620 and an end of the fixed body 610 overlap. The moving body 620 and the fixed body 610 are pin-coupled to each other at the rotary shaft 430. A pin for coupling the fixed body 610 and the moving body 620 may be provided at the rotary shaft 630. The moving body 620 is provided to be rotatable with respect to the fixed body 610 around the rotary shaft 630. When the moving body 620 is rotated, an end of the moving body 620 is moved away from the transfer object with respect to the axis in the first direction by physical contact with the transfer object, and the other end of the moving body 620 is moved closer to the axis in the first direction.

An inner surface of the moving body 620 facing the transfer object may include an inclined surface along the lengthwise direction (i.e., the first direction), e.g., the inner surface of the moving body 620 is not parallel with the first direction. At least a portion of the inner surface of the moving body 620 may be provided as an inclined surface. A region of the inner surface of the moving body 620 adjacent to the cassette 100 may be inclined. This is to guide a moving path of the transfer object when the transfer object contacts the moving body 620.

The first guide member 602 includes an elastic member 650. The elastic member 650 may include a torsional spring. The elastic member 650 is provided between the moving body 620 and the fixed body 610. The elastic member 650 is disposed at a central region of the moving body 620 and the fixed body 610. The elastic member 650 is provided at a central portion of the moving body 620 and a central portion of the fixed body 610. An end of the elastic member 650 is fixed to the moving body 620, and the other end of the elastic member 650 is fixed to the fixed body 610. A groove in which the elastic member 650 is disposed may be formed inside the moving body 620 and the fixed body 610. The elastic member 650 may be disposed to surround a pin provided to the rotary shaft 630.

A central portion of the fixed body 610 and a central portion of the moving body 620 may be coupled to each other by an elastic member 650. The elastic member 650 may determine a rotational movement range of the moving body 620. The elastic member 650 provides a restoring force to the moved moving body 620. The position of the moving body 620 is moved by physical contact with the transfer object and then returned to the original position by the restoring force of the elastic member 650.

When the transfer object is horizontally loaded in the cassette 100 or held in a horizontal state or in a correct position by the transfer assembly 300, the transfer object is transferred to and seated in the expander 200 while maintaining a predetermined distance from the guide unit 600. However, if the load state of the transfer object is poor or the transfer object is held in a state that is not horizontally maintained, the transfer object may collide with or be caught in a structure such as a guide unit 600 or a wall surface of the cassette 100. Referring to FIG. 21 to FIG. 23, the transfer object is biased to one side or is transferred in a rotated state, and thus may be in contact with the inner surface of the moving body 620. In this case, as the moving body 620 is rotated and moved with respect to the fixed body 610, the transfer object is prevented from being caught in structures such as the guide unit 600 and the wall surface of the cassette 100. Accordingly, it is possible to prevent overloading of the gripper of the transfer assembly 300. The moving body 620 rotated and moved in a direction away from the transfer object due to contact with the transfer object is returned to its original position by the restoring force of the elastic member 650. In this process, the moving body 620 pushes a side of the transfer object, and a twisted transfer object is restored to its correct position. Accordingly, an alignment of a seating position of the transfer object in the expander 200 may be improved.

The die moving unit (not shown) includes an ejector for separating each die from a wafer mounted on an expander, a camera installed on the wafer to check the position of the die and check the state of the die, and a pickup transfer apparatus for transferring the die separated from the wafer by the ejector and attaching it to a leaf frame or a substrate.

According to the inventive concept, a guide unit capable of preventing a transfer object from being caught in a structure such as a guide unit during transfer of a transfer object in a die bonding apparatus, a transfer assembly including the same, and a die bonding apparatus may be provided. In addition, a guide unit capable of correcting the alignment of the transfer object even if the transfer object is loaded on a cassette or transferred in a horizontal state or in a correct position, and a transfer assembly and a die bonding apparatus including the same may be provided. In addition, it is possible to minimize the load imposed on the gripper to prevent the gripper from dropping the transfer object. In addition, it is possible to prevent the occurrence of a transfer failure error of the transfer object and to minimize a process delay problem.

In addition, in the die bonding apparatus for transferring the transfer object, an elastic member is added to a guide unit for regulating a position of the transfer object to be variably buffered, thereby preventing a load and an entrapment during transfer.

In addition, as the guide unit consists of the fixed body and the moving body, a contact surface between the fixed body and the moving body is formed to regulate the initial position of the moving body, and an elastic member is mounted between the two bodies so that the moving body can be moved and restored with appropriate reaction force.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A transfer assembly for transferring a transfer object stored at a cassette to a target position, the transfer assembly comprising:
   a transfer robot configured to take out the transfer object stored at the cassette and to transfer in a first direction to the target position; and
   a guide unit providing a transfer passage for transferring the transfer object, and
   wherein the guide unit comprises:
   a first guide member provided with its lengthwise direction in the first direction; and
   a second guide member provided with its lengthwise direction in the first direction, and spaced apart from the first guide member in a second direction perpendicular to the first direction, the first guide member and the second guide member defining the transfer passage therebetween, and
   wherein at least a portion of the first guide member is movable such that a width of the transfer passage is changeable by the movement of the at least a portion of the first guide member;
   wherein the first guide member comprises:
   a fixed body; and
   a moving body hinged to the fixed body, the moving body being the at least a portion of the first guide member and being movable by a physical contact with the transfer object and
   wherein the moving body is rotatably movable with respect to the fixed body around an axis of a hinge;
   wherein the moving body is hinged to the fixed body at a position in which a first end of the moving body and a first end of the fixed body overlap, and
   the moving body moves in a direction away from the transfer object with respect to an axis of the first direction by the physical contact with the transfer object;
   wherein a second end of the moving body and a second end of the fixed body is coupled by an elastic member, and
   the moving body moved by the physical contact with the transfer object reverts back to an original position by a restoring force of the elastic member;
   wherein the moving body further comprises:
   a plurality of holes formed at the second end of the moving body and arranged in a row in the first direction; and
   a pin member selectively coupled to any one hole of the plurality of holes, and
   wherein a first end of the elastic member is fixed to the pin member of the moving body, and a second end of the elastic member is fixed to the fixed body.

2. The transfer assembly of claim 1, wherein the guide unit is positioned adjacent to the cassette.

3. The transfer assembly of claim 1, wherein the moving body has a first surface facing a side of the transfer object being transferred, a second surface opposite the first surface, and a third surface connected to the first surface and the second surface, and
   wherein the angle between the third surface and the first surface is greater than 90 degrees.

4. The transfer assembly of claim 1, wherein the second guide member has a structure same as the first guide member.

5. The transfer assembly of claim 1, wherein, a horizontal cross sectional area of the fixed body is larger than a horizontal cross sectional area of the moving body, and
   the moving body is disposed over the fixed body such that at least a portion of the fixed body is exposed by the moving body, the exposed portion of the fixed body being adjacent the transfer passage.

6. The transfer assembly of claim 5, wherein at least a part of the transfer object pass through over the portion of the fixed body exposed by the moving body.

7. A die bonding apparatus comprising:
   a cassette configured to store a wafer cut into a plurality of dies or a wafer ring on which the wafer cut into a plurality of dies is attached;
   a die bonder unit configured to bond a die to a substrate;
   a transfer unit configured to transfer the wafer or the wafer ring stored at the cassette in a first direction to the die bonder unit; and
   a guide unit positioned adjacent to the cassette and providing a transfer passage for the wafer or the wafer ring, and
   wherein the guide unit comprises:
   a first guide member provided with its lengthwise direction in the first direction; and
   a second guide member provided with its lengthwise direction in the first direction, and spaced apart from the first guide member in a second direction perpendicular to the first direction when seen from above, the first guide member and the second guide member defining the transfer passage therebetween, and
   wherein the first guide member is movable such that a width of the transfer passage is changeable by the movement of the at least a portion of the first guide member;
   wherein the first guide member comprises:
   a fixed body; and
   a moving body hinged to the fixed body, the moving body being the at least a portion of the first guide member and being movable by a physical contact with the transfer object and
   wherein the moving body is rotatably movable with respect to the fixed body around an axis of a hinge;
   wherein the moving body is hinged to the fixed body at a position in which a first end of the moving body and a first end of the fixed body overlap, and
   the moving body moves in a direction away from the transfer object with respect to an axis of the first direction by the physical contact with the transfer object;
   wherein a second end of the moving body and a second end of the fixed body is coupled by an elastic member, and
   the moving body moved by the physical contact with the transfer object reverts back to an original position by a restoring force of the elastic member;
   wherein the moving body further comprises:

a plurality of holes formed at the second end of the moving body and arranged in a row in the first direction; and a pin member selectively coupled to any one hole of the plurality of holes, and wherein a first end of the elastic member is fixed to the pin member of the moving body, and a second end of the elastic member is fixed to the fixed body.

8. A guide unit configured to guide a transfer object being transferred in a first direction from a cassette storing the transfer object to a target position, the guide unit comprising:

a first guide member provided with its lengthwise direction in the first direction; and a second guide member provided with its lengthwise direction in the first direction, and spaced apart from the first guide member in a second direction perpendicular to the first direction when seen from above, the first guide member and the second guide member defining a transfer passage therebetween, and wherein the first guide member includes a body moving in a direction away from the transfer object with respect to an axis of the first direction by a physical contact with the transfer object during a transfer of the transfer object;

wherein the body comprises:

a fixed body;

a moving body hinged to the fixed body, the moving body being at least a portion of the first guide member and being movable by the physical contact with the transfer object and wherein the moving body is rotatably movable with respect to the fixed body around an axis of a hinge;

wherein the moving body is hinged to the fixed body at a position in which a first end of the moving body and a first end of the fixed body overlap, and the moving body moves in a direction away from the transfer object with respect to an axis of the first direction by the physical contact with the transfer object;

wherein a second end of the moving body and a second end of the fixed body is coupled by an elastic member, and the moving body moved by the physical contact with the transfer object reverts back to an original position by a restoring force of the elastic member;

wherein the moving body further comprises:

a plurality of holes formed at the second end of the moving body and arranged in a row in the first direction; and a pin member selectively coupled to any one hole of the plurality of holes, and wherein a first end of the elastic member is fixed to the pin member of the moving body, and a second end of the elastic member is fixed to the fixed body.

* * * * *